US009057958B2

(12) United States Patent
Armstrong et al.

(10) Patent No.: US 9,057,958 B2
(45) Date of Patent: Jun. 16, 2015

(54) APPARATUS FOR THERMAL DEVELOPMENT WITH A CONFORMABLE SUPPORT

(71) Applicant: E I DU PONT DE NEMOURS AND COMPANY, Wilmington, DE (US)

(72) Inventors: Mark L. Armstrong, Wilmington, DE (US); Hao Chang, Lansdale, PA (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 13/934,409

(22) Filed: Jul. 3, 2013

(65) Prior Publication Data

US 2013/0295508 A1 Nov. 7, 2013

Related U.S. Application Data

(62) Division of application No. 12/283,341, filed on Sep. 11, 2008, now Pat. No. 8,492,073.

(60) Provisional application No. 61/072,436, filed on Mar. 31, 2008.

(51) Int. Cl.
*B41N 1/00* (2006.01)
*B41N 3/00* (2006.01)
*G03F 7/26* (2006.01)
*G03F 7/34* (2006.01)
*G03F 7/36* (2006.01)

(52) U.S. Cl.
CPC .. *G03F 7/26* (2013.01); *G03F 7/34* (2013.01); *G03F 7/36* (2013.01)

(58) Field of Classification Search
CPC ..................................... G03F 7/20; G03F 7/70
USPC ................... 430/300–309; 101/453, 463.1
See application file for complete search history.

(56) References Cited

U.S. PATENT DOCUMENTS

| | | |
|---|---|---|
| 3,060,023 A | 3/1963 | Burg et al. |
| 3,264,103 A | 8/1966 | Cohen et al. |
| 4,052,357 A | 10/1977 | Marinik |
| 4,264,705 A | 4/1981 | Allen |
| 4,323,636 A | 4/1982 | Chen |
| 4,323,637 A | 4/1982 | Chen et al. |
| 4,427,759 A | 1/1984 | Gruetzmacher et al. |
| 4,460,675 A | 7/1984 | Gruetzmacher et al. |
| 4,547,453 A | 10/1985 | Worns et al. |
| 4,582,777 A | 4/1986 | Fischer et al. |
| 4,684,600 A | 8/1987 | Worns et al. |
| 4,726,877 A | 2/1988 | Fryd et al. |
| 4,753,865 A | 6/1988 | Fryd et al. |
| 5,006,447 A | 4/1991 | Umeda et al. |
| 5,015,556 A | 5/1991 | Martens |
| 5,175,072 A | 12/1992 | Martens |
| 5,215,859 A | 6/1993 | Martens |
| 5,262,275 A | 11/1993 | Fan |
| 5,279,697 A | 1/1994 | Peterson et al. |
| 5,506,086 A | 4/1996 | Van Zoeren |
| 5,607,814 A | 3/1997 | Fan et al. |
| 5,719,009 A | 2/1998 | Fan |
| 5,766,819 A | 6/1998 | Blanchet-Fischer |
| 5,840,463 A | 11/1998 | Blanchet-Fischer |
| 5,860,360 A | 1/1999 | Lane, III |
| 5,962,111 A | 10/1999 | Rach |
| 6,797,454 B1 | 9/2004 | Johnson et al. |
| 6,998,218 B2 | 2/2006 | Markhart |
| 7,041,432 B2 | 5/2006 | Markhart |
| 7,044,055 B2 | 5/2006 | Gotsick et al. |
| 7,152,529 B2 | 12/2006 | Gotsick et al. |
| 7,237,482 B2 | 7/2007 | Vest et al. |
| 2001/0037713 A1* | 11/2001 | Seyna et al. ................ 83/698.41 |
| 2003/0180655 A1* | 9/2003 | Fan et al. ................... 430/270.1 |
| 2003/0217661 A1* | 11/2003 | Schnieders ................... 101/376 |
| 2004/0120739 A1 | 6/2004 | Chen |
| 2005/0142494 A1 | 6/2005 | Hackler et al. |
| 2005/0247222 A1 | 11/2005 | McLean et al. |
| 2005/0250043 A1 | 11/2005 | McLean et al. |
| 2005/0277062 A1 | 12/2005 | McLean et al. |
| 2006/0027113 A1 | 2/2006 | Hackler et al. |
| 2006/0029880 A1 | 2/2006 | McMillen et al. |
| 2006/0104675 A1 | 5/2006 | Dudek et al. |
| 2006/0105268 A1 | 5/2006 | Vest |
| 2006/0134557 A1* | 6/2006 | Hackler et al. ................ 430/311 |
| 2006/0234152 A1 | 10/2006 | Hackler et al. |
| 2007/0059642 A1 | 3/2007 | Dudek et al. |
| 2008/0053326 A1* | 3/2008 | Murphy et al. ............... 101/395 |
| 2011/0117500 A1 | 5/2011 | Hennessy et al. |

FOREIGN PATENT DOCUMENTS

| | | |
|---|---|---|
| EP | 0 057 593 A2 | 11/1982 |
| EP | 0 177 302 A2 | 9/1986 |
| EP | 741 330 A1 | 6/1998 |
| WO | WO 98/13730 | 4/1998 |
| WO | WO 2007/012023 A2 | 1/2007 |

OTHER PUBLICATIONS

J.S. Havinga, S. De Meij: "Engineering with natural rubber", NATUURRUBBER, vol. 13, Feb. 1, 1999, pp. 2-3, Jan. 2, 1999.
Anonymous: "BISCO™ Silicones expand the parameters of possibility in product design engineering" Internet Article, [Online] Nov. 3, 2006, XP002528700 Retrieved from the Internet: URL:www.merryweather.com/pdfs/BISCO%20Cellular%20Silicone.pdf>
[retrieved on May 18, 2009] * p. 1 *.
Li Z et al: "Determination of the elastic moduli of silicone rubber coatings and films using depth-sensing indentation" Polymer, Elsevier Science Publishers B.V, GB, vol. 45, No. 16, Jul. 21, 2004, pp. 5403-5406, XP004526814, ISSN: 0032-3861 * table 1 *.

* cited by examiner

*Primary Examiner* — Chanceity Robinson

(57) ABSTRACT

The present invention provides a method and apparatus for forming a printing form from a photosensitive element to form a relief pattern. The method and apparatus thermally develop the photosensitive element by heating a composition layer of the element to cause a portion of the layer to liquefy and providing a development medium to the element to remove the liquefied composition. A conformable layer is disposed between the photosensitive element and a base support, which improves the compressibility and the contact between the photosensitive element and the development medium. The method and apparatus improve the efficiency of the removal of liquefied portions from the photosensitive element and the uniformity of the relief pattern formed.

20 Claims, No Drawings

APPARATUS FOR THERMAL DEVELOPMENT WITH A CONFORMABLE SUPPORT

BACKGROUND OF THE INVENTION

1. Field of the Disclosure

This invention pertains to a method for thermally developing a photosensitive element, and particularly to a method for forming a relief printing form from the photosensitive element.

2. Description of Related Art

Flexographic printing plates are well known for use in printing surfaces which range from soft and easy to deform to relatively hard, such as packaging materials, e.g., cardboard, plastic films, aluminum foils, etc. Flexographic printing plates can be prepared from photosensitive elements containing photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a photopolymerizable layer interposed between a support and a coversheet or multilayer cover element. Upon imagewise exposure to actinic radiation, photopolymerization of the photopolymerizable layer occurs in the exposed areas, thereby curing and rendering insoluble the exposed areas of the layer. Conventionally, the element is treated with a suitable solution, e.g., solvent or aqueous-based washout, to remove the unexposed areas of the photopolymerizable layer leaving a printing relief which can be used for flexographic printing. However, developing systems that treat the element with a solution are time consuming since drying for an extended period (0.5 to 24 hours) is necessary to remove absorbed developer solution.

As an alternative to solution development, a "dry" thermal development process may be used which removes the unexposed areas without the subsequent time-consuming drying step. In a thermal development process, the photosensitive layer, which has been imagewise exposed to actinic radiation, is contacted with an absorbent material at a temperature sufficient to cause the composition in the unexposed portions of the photosensitive layer to soften or melt and flow into an absorbent material. See U.S. Pat. No. 3,060,023 (Burg et al.); U.S. Pat. No. 3,264,103 (Cohen et al.); U.S. Pat. No. 5,015,556 (Martens); U.S. Pat. No. 5,175,072 (Martens); U.S. Pat. No. 5,215,859 (Martens); and U.S. Pat. No. 5,279,697 (Peterson et al.). The exposed portions of the photosensitive layer remain hard, that is do not soften or melt, at the softening temperature for the unexposed portions. The absorbent material collects the softened un-irradiated material and then is separated from the photosensitive layer. The cycle of heating and contacting the photosensitive layer may need to be repeated several times in order to sufficiently remove the flowable composition from the un-irradiated areas and form a relief structure suitable for printing. After such processing, there remains a raised relief structure of irradiated, hardened composition that represents the irradiated image.

Processors for thermal development of flexographic printing elements are known. U.S. Pat. Nos. 5,279,697 and 6,797,454 each describe an automated process and apparatus for handling an irradiated printing element and accomplishing repeated heating and pressing to remove the unirradiated composition from the element with a web of absorbent material. Both apparatuses include a drum for supporting the photosensitive element during thermal development. An outer surface of the drum may be tacky to temporarily adhere the photosensitive element to the drum. The photosensitive element is mounted on the drum with the element residing on the tacky layer and, during thermal development the absorbent material contacts an exterior surface of the photosensitive element. The preheating drum can be coated with a silicone rubber composition layer having a Shore A hardness rating between about 30 and 60. The rubber coating may be impregnated with aluminum particles. The resilient surface provide by the rubber can result in a longer nip zone as a result of the surface deflecting under the pressure exerted by a hot roller. The hot roll supports the absorbent material in contact with the photosensitive element to heat the element and remove the molten polymer with the absorbent material.

U.S. Patent Application Publication 2005/0142494 A1 describes a method and apparatus for thermal development in which a photosensitive element is supported on a base member with a removable flexible support member. In one embodiment, the flexible support member need not include a carrier and can be formed of a layer of a self-supporting material, such as a compressible material, U.S. Patent Application Publication US 2006/0029880 A1 describes a method and apparatus for thermal development in which a photosensitive element is supported on a base member. U.S. Patent Application Publication US 2006/0134557 A1 describes a method and apparatus for thermal development in which a photosensitive element is supported on a base member having an exterior textured surface. These publications describe that the base member (or the support member) can include a resilient layer. The resilient layer can be composed of any material suitable to provide a Shore A hardness between about 30 and about 75, such as natural rubbers and elastomeric materials and synthetic rubbers and elastomeric materials, including rubber, silicone rubber, and compressible foams.

International Publication Number WO 2007/012023 A2 describes a method and apparatus for processing flexographic printing plates. In one embodiment, the apparatus may include a conformal thermally conductive cushioned surface located between a flexographic plate and a support plate to create a cushioned surface to support the flexographic plate.

In two embodiments of a thermal processor, commercially identified as CYREL® FAST 1000TD and CYREL® FAST TD4260 processors, an exterior surface of the drum includes a silicone rubber layer having a Shore A hardness of 50, and a tackification layer on the rubber layer. The tackification layer is DOW 236, a silicone dispersion in solvent, available from Dow Corning.

A problem sometimes arises with thermal processing in that the uncured photopolymer is not always adequately cleaned out or removed from recessed areas of the relief surface of the printing element. Inadequate clean out of recessed areas can manifest as insufficient removal of photopolymer material to the relief depth desired and/or as a non-uniformity of relief depth between open floor areas and in relatively narrow channels or gaps between large raised areas (i.e., typically solid printing areas). Relief depth is the difference between thickness of a floor of cured polymer and the thickness of the printing layer in the printing element.

It is particularly difficult to adequately dean out or remove uncured photopolymer material in relief printing forms in which the photopolymerizable layer has a thickness greater than about 100 mil, and becomes progressively more difficult as the thickness of the photopolymerizable layer increases. The thickness of some photopolymerizable relief printing forms can be as much as 250 mils or more. Thick relief printing forms are used primarily in printing of corrugated board, sometimes referred to as corrugated paperboard. The relief depth for the thick printing forms can be as much as about half of the thickness of the photopolymer layer.

Oftentimes, in order to achieve improved relief uniformity the pressure at the nip between the hot roll carrying the absorbent material and drum carrying the photosensitive element can be increased to impress the absorbent material into the recessed areas. Increased nip pressure compresses the element creating a wider contacting zone for the nip, i.e., footprint, on the element along an axial length of the drum as well as increases the residence (i.e., dwell) time for the transfer of heat to the element. However, increased residence time that raises temperatures at or above the glass transition temperature of the base support for the element, can result in distortion or deformation of the resulting printing form or plate. Deformations include waves of localized distortions resulting in a non-planar topography of the photosensitive element. Waves of distortions can form in different locations in each element processed. In addition the hot roll has a tendency to deflect or bow along its length, resulting in non-uniform application of pressure to the photosensitive element along axial length of the contact zone. Non-uniform application of pressure can contribute to the resulting relief structure of the printing form having non-uniform relief depth.

Relief printing forms having incomplete clean out or removal of recessed areas of the relief surface can result in poor print performance, that is, poor reproduction of the image printed on the substrate. Relief printing is a method of printing in which the printing form prints from an image area, where the image area of the printing form is raised and the non-image area is depressed or recessed. Recessed areas, such as the floor, that are not cleaned out sufficiently are shallow, and thus can pickup ink and contact to transfer the ink onto the substrate in regions that are not to be printed. This is sometimes referred to as "printing the floor". In other instances, small dirt particles or lint can cling to the shallow recessed areas, pickup ink, and transfer ink (with or without the dirt particle) to the substrate, which can render the printed image "dirty". This effect of printing shallow floors or dirt can be exacerbated since the printing form is often in pressure contact with the substrate.

Relief printing forms having distortion/s in the support and/or the cured photopolymeric layer also result in poor print performance. In multicolor printing, when one or more of the relief printing forms have distortion the printed image has poor registration. Even in single color printing, distortion in the relief printing form may print an image that is not an accurate reproduction of its original, so called image infidelity, by printing straight lines as curves for example. The relief printing form having distortion/s may also incompletely print the image due to intermittent contact of the inked surface of the printing form to the printed substrate.

SUMMARY OF THE INVENTION

The present invention provides a method for forming a printing form from a photosensitive element having an exterior surface and containing a composition layer capable of being partially liquefied. The method includes supplying a development medium to the exterior surface, supporting the photosensitive element on a base member, heating the exterior surface to a temperature sufficient to cause a portion of the layer to liquefy; and contacting the photosensitive element with the development medium to allow at least a portion of the liquefied material of the composition layer to be removed by the development medium, wherein a conformable material having a compression modulus between 3 and 1500 psi is disposed between the base member and the side of the photosensitive element.

The invention also provides an apparatus for forming a printing form from the photosensitive element comprising means for supplying a development medium to the exterior surface; means for supporting having an outer surface for supporting the photosensitive element; means for heating the exterior surface to a temperature sufficient to cause a portion of the layer to liquefy; and means for contacting the photosensitive element with the development medium to allow at least a portion of the liquefied material of the composition layer to be removed by the development medium, wherein a conformable material having a compression modulus between 3 and 1500 psi is disposed adjacent the outer surface of the means for supporting.

DESCRIPTION OF THE PREFERRED EMBODIMENT(S)

The present invention relates a method for forming a printing form from a photosensitive element, and in particular to a method for forming a relief printing form from the photosensitive element. In some embodiments the printing form includes a relief pattern that is particularly suited for relief printing, including use as a flexographic printing form and letterpress printing form. Relief printing is a method of printing in which the printing form prints from an image area, where the image area of the printing form is raised and the non-image area is depressed. In some embodiments, the printing form is suited for gravure or gravure-like printing. Gravure printing is a method of printing in which the printing form prints from an image area, where the image area is depressed and consists of small recessed cups or wells to contain the ink or printing material, and the non-image area is the surface of the form. Gravure-like printing is similar to gravure printing except that a relief printing form is used wherein the image area is depressed and consists of recessed areas forming wells to carry the ink which transfer during printing. The present invention also contemplates a method for thermally treating a photosensitive element having a layer of composition capable of being partially liquefied to a temperature sufficient to melt or soften or liquefy at least a portion of the layer for any purpose, and removing the portion of the liquefied material.

In particular, the present invention relates to a method for forming a printing form from the photosensitive element wherein a conformable material is disposed between the photosensitive element and a base member for supporting the element during treatment. In most embodiments, the conformable material is a layer that is adjacent to a side of the photosensitive element having a support, which is opposite an exterior surface where a portion of the composition layer liquefies. The presence of the conformable layer adjacent the photosensitive element during thermal treatment allows for greater conformity between the photosensitive element and the development medium compared to thermal development systems of the prior art. Increased conformity provides increased contact of the development medium to the relief surface that is forming in the printing element, thereby improving the removal of uncured or unpolymerized material from the recessed areas of the relief surface. The presence of the conformable layer disposed adjacent the photosensitive element not only provides more efficient removal of uncured polymer but also provides improved uniformity of clean out in the recessed areas across various image features, such as in narrow gaps and channels between solid raised (printing)

areas, in open floor areas, and between halftone dots, reverses, and lines. Deep relief depths, up to about half of the thickness of the printing layer, can also be achieved in printing forms with the use of the conformable layer between the photosensitive element and the base member.

In addition, the present method can be conducted with less heat input, e.g., at lower hot roll temperature and reduced infrared heating, to avoid excessive heat at temperatures that tend to distort the printing form. The presence of the conformable material opposite the exterior surface of the photosensitive element provides increased conformity and contact between the element and the development medium. Increased conformity reduces the need to increase pressure at the nip and the residence time for the transfer of heat to the element and thus the possibility of increasing the temperature above a distortion temperature of the element. Another advantage of operating at lower temperatures is in the reduction of energy consumption by the apparatus, that is, the operating costs of the apparatus are less than other thermal development apparatuses that operate at higher temperatures. Operating at lower temperatures can also provide an advantage in that the vapor (as well as the condensate) generated from the uncured portions of the photosensitive element by thermal development is reduced.

Thermal treatment (which may also be referred to as thermal development) heats the photosensitive element to a development temperature that causes uncured portions of the composition layer to liquefy, i.e., melt or soften or flow, and be carried away or removed by contact with a development medium. The development medium may also be referred to herein as development material, absorbent material, absorbent web, and web. Cured portions of the photosensitive layer have a higher melting or softening or liquefying temperature than the uncured portions and therefore do not melt, soften, or flow at the thermal development temperatures. Thermal development of photosensitive elements to form flexographic printing plates is described in U.S. Pat. Nos. 5,015,556; 5,175,072; 5,215,859; and WO 98/13730. The photosensitive element includes a support (or base support) and at least a composition layer adjacent the support. The composition layer is capable of being partially liquefied.

The term "melt" is used to describe the behavior of the unirradiated portions of the composition layer subjected to an elevated temperature that softens and reduces the viscosity to permit removal by the development medium. The material of the meltable portion of the composition layer is usually a viscoelastic material which does not have a sharp transition between a solid and a liquid, so the process functions to absorb the heated composition layer at any temperature above some threshold for absorption in the absorbent material. Thus, the unirradiated portions of the composition layer soften or liquefy when subjected to an elevated temperature. However throughout this specification the terms "melting", "softening", and "liquefying" may be used to describe the behavior of the heated unirradiated portions of the composition layer, regardless of whether the composition may or may not have a sharp transition temperature between a solid and a liquid state. A wide temperature range may be utilized to "melt" the composition layer for the purposes of this invention. Removal by the development medium encompasses absorption by the development medium that can be considered an absorbent material. Removal may be slower at lower temperatures and faster at higher temperatures during successful operation of the process.

Apparatuses suitable for thermally developing the photosensitive element are disclosed by Peterson et al. in U.S. Pat. No. 5,279,697; and also by Johnson et al. in U.S. Pat. No. 6,797,454 B1. U.S. Pat. No. 5,279,697 shows embodiments of the apparatus in which the photosensitive element is placed on a planar surface or on a drum for thermal treatment. U.S. Pat. No. 6,797,454 shows a drum supporting the photosensitive element for thermal treatment. It should be understood that one of ordinary skill in the art could modify the apparatuses to place the element on two or more support rolls, a combination of planar surface/s and roll/s, such as a belt supported system, for treatment. Another apparatus suitable for thermally developing the photosensitive element is disclosed by Dudek et al. in Pub. No. US 2006/0104675 A1 in which a printing form is formed from a photosensitive element having a cylindrical support. U.S. Pat. Nos. 6,998,218; 7,041,432; 7,237,482 describe an apparatus, method, and system for thermally developing flexographic printing sleeves in which a rotatable support is a means for supporting a flexographic printing element. U.S. Pat. No. 7,044,055 and U.S. Pat. No. 7,152,529 describe a method and a system for thermal development of flexographic printing plates in which a photosensitive printing element is positioned on a continuous loop of a conveyor and a heatable roller is urged towards the element on the conveyor. It should be understood that one of ordinary skill in the art could modify each of the above apparatuses to accommodate the present inventive method for forming a printing form by disposing the conformable material between the photosensitive element and a base member. Any structure that supports or holds a photosensitive element during thermal treatment, such as but not limited to, a drum, one or more support rolls, a belted supported system, a plate or planar member, an arcuate platform, can be considered a base member or a means for supporting the photosensitive element. One embodiment of the base member is a drum. Another embodiment of the base member is a support roll.

The photosensitive element in many embodiments depicted in these apparatuses is in the form of a plate. The plate may be clamped onto a drum for thermal development in the round, or onto a flat base for thermal development in a planar orientation or a press. However, it should be understood that one of ordinary skill in the art could modify each of the disclosed apparatuses to accommodate the mounting of the photosensitive element in any form suitable for printing. In addition to plates, the photosensitive element can include the form of a cylinder, i.e., a sleeve, or a plate-on-sleeve or plate-on-carrier. The photosensitive element may be a continuous, seamless or substantially seamless photopolymerizable composition layer adjacent a cylindrically-shaped support. The cylindrically-shaped support may be referred to as a sleeve. Typically, plate-on-sleeve is a photosensitive element that includes at least the composition layer on a planar support, which is then mounted onto a cylindrically-shaped support. Typically, the plate-on-carrier is a photosensitive element that includes at least the composition layer on a planar support, which is then mounted onto a flexible sheet, known as a carrier sheet. Oftentimes, multiple photosensitive elements are mounted onto the carrier at various spaced locations.

The method includes supporting the photosensitive element on the base member wherein a conformable material is disposed between the base member and a side of the photosensitive element opposite the exterior surface, and the conformable material has a compression modulus between about 3 and 1500 pounds per square inch (psi) (20.7 and 10342.1 kilo Pascals (kPa)). Since the photosensitive element typically includes a support or base for the layer of the photopolymerizable composition, the side of the element opposite the exterior surface may also be referred to as the backside or support side or base side of the element. In some embodiments, the conformable layer is adjacent and in contact with support side of the photosensitive element. In some other embodiments the conformable layer is adjacent to but not in direct contact with the support side of the photosensitive element, for example, an additional layer may be interposed between the conformable layer and the photosensitive element. Provided that the one or more additional layers do not interfere with or significantly alter the compressible nature of the conformable material, it is contemplated that one or more additional layers may be interposed on the layer of conformable material or independent thereof. Examples of an additional layer on the conformable material is a layer of a material such as a film or coating for use as a protective layer, a release layer, an antistatic layer, or a tacky layer, but is not so limited. The layer is relatively thin, having a thickness suitable for its intended purpose, without significantly influencing the compressibility of the conformable layer. In one embodiment the additional layer has a thickness of about 0.001 to 10 mm. It is also contemplated that the support side of the photosensitive element may include one or more additional layers opposite the exterior surface.

The layer of conformable material may have one or more dimensions that are the same as or different from one or more of the dimensions of the photosensitive element being treated. For example in embodiments in which the photosensitive element is a plate or planar structure, the conformable layer may have a length and a width that each may be equal, longer, or shorter than the length and width of the photosensitive element. In some embodiments, the planar dimensions (length and width) of the conformable layer is matched to the planar dimension of the photosensitive element. The thickness of the layer of conformable material is not particularly limited, provided that the layer meets the desired range of compression modulus. In some embodiments, the thickness of the layer of conformable material is between 0.1 and 50 mm. In some embodiments, the thickness of the layer of conformable material is between 0.1 and 25 mm. In other embodiments, the thickness of the layer of conformable material is between 1 and 20 mm. In yet other embodiments, the thickness of the layer of conformable material is between 1 and 15 mm.

In some embodiments, the layer of conformable material may be removable from the base member, allowing for quick and easy replacement of the conformable material when worn. The capability to remove the conformable material also allows for the conformable material to be independently selected for each photosensitive element undergoing thermal treating to accommodate the many possible different types, sizes, and/or thicknesses of elements that could be treated in the apparatus. The layer of conformable material can be secured or held to the base member by the same method or device that secures the photosensitive element to the base member. In some embodiments, the conformable material can be attached or permanently secured to the base member, rendering the conformable material unitary with the base member. The means by which the conformable material is attached or secured to the base member is not limited. In yet another embodiment, the conformable material may be included as a layer on a removable flexible support member as described by Hackler et al. in U.S. Patent Application Publication US 2005/0142494 A1. The flexible support member is removable to allow for easy replacement upon wear or deterioration of a surface that supports the printing element. The flexible support member is mounted typically under tension onto an exterior surface of a base member (e.g., drum) that supports the photosensitive element during thermal development. In one embodiment, the flexible support member includes a carrier member and can include a layer of a modification material. For purposes of the present invention the conformable material having a compression modulus of about 3 to 1500 psi may be used as the modification material.

Since in some embodiments a resilient layer and/or tacky layer may be present on the base member, the conformable material may reside on or above the resilient and/or tacky layers so that the conformable material is adjacent (and closer) to the photosensitive element to provide the desired improvements in conformity and contact of the element with the development medium. It should be understood that the rubber coating that provides a resilient surface on base supports of the prior art, such as drums, is different from the present invention where the conformable material has a compression modulus between about 3 and 1500 psi. In the prior art, a resilient surface on a drum can have a Shore A hardness rating between about 30 and 75. Durometer is one of several ways to indicate the hardness of a material, and is defined as the resistance of a material to permanent indentation. Durometer measures the depth of an indentation in the material created by a given force on a standardized presser foot. There are several scales of durometer, of which the Shore A scale is typically used for softer plastics. Each scale results in a value between 0 and 100, with higher values indicating a harder material. In some embodiments, the conformable material having a Shore A durometer of less than about 30 provides the desired improvements in conformity and contact of the element with the development medium. In some embodiments, the conformable material having a Shore A durometer of less than about 25 provides the desired improvements in conformity and contact of the element with the development medium. (Note that in some instances materials having Shore A durometer less than 10 (i.e., range of 0 to 10) may not be reproducibly characterized, but are still encompassed within the present invention.) Yet in other embodiments, the conformable material of the present invention is significantly softer (less hard or less resilient) such that the conformable layer cannot be characterized by the Shore A durometer, and thus the conformable material is characterized by the compression modulus. The range of compression modulus of about 3 to 1500 psi represents conformable materials that provide the desired improvements in conformity and contact of the element with the development medium, and may overlap in part with embodiments of the conformable material having Shore A durometer less than about 30. In some embodiments, the range of compression modulus of about 3 to 1500 psi represents conformable materials that provide the desired improvements in conformity and contact of the element with the development medium, and may overlap in part with embodiments of the conformable material having Shore A durometer less than about 25. In yet some other embodiments, the range of compression modulus of about 3 to 1500 psi represents conformable materials that provide the desired improvements in conformity and contact of the element with the development medium, and may overlap in part with embodiments of the base member with a resilient layer having Shore A durometer less than about 35.

The compression modulus of the conformable material is determined from a simple compression test in which the material is compressed and deformation at various loads is recorded. Compressive stress and strain are calculated from the recorded compression load and material deformation, and plotted as a curve in a stress-strain diagram. The compression modulus is determined from a slope of the initial region of the stress-strain curve. Typically, the initial region of the stress-strain curve is a straight-line portion of the curve. The compression modulus is the ratio of an increment of stress to an increment of strain, or stress divided by the strain. For the present invention, the compression modulus is the initial slope of the stress and strain curve where the relationship between stress and strain is linear, such that a material can recover from stress and strain. The compression modulus may also be referred to as modulus, or support factor. The stress-strain diagram and the compression modulus are mechanical characteristics well known to those of ordinary skill. A description of these and other mechanical properties of materials, and analysis thereof, can be found in any handbook or references on polymeric foams and rubbers.

An instrument suitable for measuring the compression of the conformable material is a universal test machine for testing compression (and extension) of materials. A universal test machine suitable for measuring compression is made by Instron (Norwood, Mass.), Model 1125. The instrument for testing compression includes a flat compression foot that is larger than the sample of conformable material being tested, which is connected to a force-measuring device and mounted in a manner such that the sample can be deflected or compressed. A range of 0 to 5000 lbs. is used for the load cell on the compression foot. The instrument is arranged to support the sample on a level horizontal plate that is perforated with holes to allow for rapid escape of air during the test. A compression fixture from JT&M Die Set (Part#3MDS, Janesville Tool & Manufacturing Inc., Milton, Wis., USA) can be used to keep both surfaces of the compression foot and the horizontal plate parallel. The instrument may also be enhanced with an EIN-5 Laser Extensometer to precisely measure the compression strain. For the compression test, the compression foot exerts a bad on the sample of conformable material between 0 and 5000 lbs., and moves at a rate of 50±5 mm per minute. This simple compression test basically follows the protocol for the measurement of the compression force deflection (CFD) according to Test C of standard test method ASTM standard D3574-05 titled "Standard Test Method for Flexible Cellular Materials—Slab, Bonded, and Molded Urethane Foams". However, CFD values are not used because the ASTM D3574-5 method pre-loads the sample (e.g., contact bad) and allows for creep of the sample for 60 seconds, which is believed to make the CFD test not as representative of the compression condition/s experienced by the conformable material in the present method as the simple compression test. The compression force deflection test measures only the force necessary to produce 50% compression deformation of a foam sample. Also the ASTM standard calls for 25 mm (1 in) thick sample of the material for testing, but the layer of conformable material useful in the present invention is not limited to this recited thickness.

The compression test is conducted on a sample of the conformable material at the thickness that will be used as the conformable layer. The compression modulus determined from the stress-strain curve will thus be based upon the thickness of the conformable layer as used in the present method. Typically the materials suitable for the conformable layer are supplied as a single ply having a thickness less than 25 mm (1 in), but are not necessarily so limited. In some embodiments, the layer of the conformable material used will be single ply that has a thickness less than 25 mm. In this instance, the compression test will be conducted on the single ply of the material. In other embodiments, the layer of conformable material used will be two or more plys that have a total thickness less than 25 mm. In this instance, the compression modulus of the conformable material will be determined based on the two or more plys of the material. In other embodiments, the layer of conformable material used will have one (or more) ply that has a total thickness greater than 25 mm. In this instance the compression modulus of the conformable material will be determined based on the one (or more) ply of the material.

In some embodiments, the compression modulus of the conformable material is between about 3 and 1500 psi (20.6 and 10342.5 kPa). In some embodiments, the compression modulus of the conformable material is between about 3 and 100 psi. In some embodiments, the compression modulus of the conformable material is between about 5 and 100 psi. In other embodiments, the compression modulus of the conformable material is between about 5 and 55 psi. In other embodiments, the compression modulus of the conformable material is between about 3 and 75 psi. In yet other embodiments, the compression modulus of the conformable material is between about 55 and 100. In yet other embodiments, the compression modulus of the conformable material is between about 10 and 350.

In some embodiments, the compression modulus can also be within ranges defined by any two of the following values, and inclusive of the range values, expressed in psi; 3, 5, 10, 25, 50, 75, 100, 150, 200, 250, 300, 350, 400, 450, 500, 550, 600, 650, 700, 750, 800, 850, 900, 950, 1000, 1050, 1100, 1150, 1200, 1250, 1300, 1350, 1400, 1450 and 1500.

Materials suitable as the conformable material are not limited, and include for example, foams and elastomeric materials of polyethylenes, polyurethanes, polyesters, natural rubbers, silicon rubbers, and polystyrenes. The foams and elastomeric materials can be natural or synthetic. In some embodiments, the conformable material is polyethylene foam. Foams may have an open cell or closed cell structure. The conformable material should withstand temperatures required to process the photosensitive element during heating.

Supplying the development medium to the photosensitive element positions the development medium adjacent the exterior surface of the photosensitive element. The development medium is supplied to the exterior surface of the photosensitive element with the supply member. The development medium resides on the supply member. The supply member is a means for supplying the development medium to the exterior surface of the element. The supply member has a cross-sectional shape that is not limited, and can include, for example, circular, semi-circular, elliptical, parabolic, arcuate including convex and concave surfaces, wedge, triangular, rectangular, and other polygonal shapes. The shape of the contact member can be symmetrical or asymmetrical. One embodiment for the supply member is a cylindrically-shaped roll. Typically the supply member has a circular cross-sectional shape and is heated, and thus may be referred to as a hot roll or hot roller. The supply member is positioned adjacent the photosensitive element that is supported by the base member. When the development medium is provided in contact with the exterior surface of the photosensitive element, the nip is formed between the development medium supplied by the supply member, e.g., hot roll, and the photosensitive element carried by the base member. In some embodiments, the development medium may traverse across the supply member while in contact with the photosensitive element.

The development medium may also be referred to as absorbent material, web, and continuous web. The development medium is selected to have a melt temperature exceeding the melt or softening or liquefying temperature of the unirradiated or uncured portions of the radiation curable composition and having good tear resistance at the same operating temperatures. Preferably, the selected material withstands temperatures required to process the photosensitive element during heating. Materials suitable as the development medium is not limited and can be selected from non-woven materials, paper stocks, fibrous woven material, open-celled foam materials, porous materials that contain more or less a substantial fraction of their included volume as void volume. The development medium can be in web or sheet form. The development medium should also possess a high absorbency (i.e., polymer removal efficiency) for the molten elastomeric composition as measured by milligrams of elastomeric composition that can be absorbed per square centimeter of the development medium. It is also desirable that fibers are bonded in development medium so that the fibers are not deposited into the plate during development. A non-woven material in web form is preferred.

The exterior surface of the composition layer of the photosensitive element is heated to a temperature sufficient to cause a portion of the layer, i.e., unirradiated area, or an uncured or unpolymerized portion, to liquefy. Means for heating the at least one photosensitive layer (and additional layer/s if present) can be by conduction, convection, radiation or other heating methods that heat the layer to a temperature sufficient to effect melting of the uncured portions but not so high as to effect distortion of the cured portions of the layer. One or more additional layers disposed above the composition layer may soften or melt or flow and be removed as well by the development medium. The photosensitive element is heated to a surface temperature above about 40° C., preferably from about 40° C. to about 230° C. (104-446° F.) in order to effect melting or flowing of the uncured portions of the composition layer.

The exterior surface of the photosensitive element can be heated by one or more sources in a thermal development apparatus. Independently or in any combination, the sources for heating are capable of heating the exterior surface of the photosensitive element to a temperature sufficient to cause a portion of the composition layer to at least partially liquefy. The method for heating each of the sources are not limited and can include, for example, an electrical core heater, electric heating blanket, steam, oil, hot air, and other heating sources that can provide a temperature sufficient to maintain or elevate the temperature of the exterior surface to melt a portion of the composition layer. In one embodiment, heating of the exterior surface of the photosensitive element is with a radiant heater and a source for heating the support member.

In one embodiment the heating source is associated with the supply member that heats the exterior surface of the composition layer while supplying the development medium to the element. Heat is transferred by conduction from the supply member through the development medium to the exterior surface of the element upon contact, raising the temperature of the element and causing the uncured portions of the composition layer of the element to melt, soften, or flow into the development medium.

The processor may include another source for heating that is a focused radiant heater/s directed at the exterior surface of the photosensitive element. The radiant heater can apply all or a portion of the heat needed to the exterior surface of the composition layer, to elevate the temperature of the exterior surface of the composition layer sufficient to melt the unirradiated portion of the composition layer, causing a portion of the layer to liquefy. The heater can include one or a plurality of tubular infrared heating bulb/s mounted in end supports that also provide electrical connections to the bulb/s. The heater can also include a reflector adjacent to the bulb/s that acts to focus and direct the infrared radiation toward the exterior surface of the element.

Another heating source is associated with the base member that supports the photosensitive element during thermal development. The base member may be equipped with a heater, such as a blanket heater, which is provided to keep the photosensitive element at a stable starting temperature independent of the surrounding environment. The base member may include means for controlling a temperature of the base member, which helps to manage the thermal conditions experienced by the photosensitive element. In particular the means for controlling the temperature can be used to maintain the temperature of the support side of the photosensitive element. The means for controlling the base member temperature can include means for heating, means for cooling, and a combination thereof. Any means of heating the base member is acceptable, as long as the power capacity of the heater is sufficient to maintain a fairly constant selected skin temperature on the outer surface of the base member. In this embodiment, the source for heating the base member is capable of providing a portion of the heat to elevate the temperature of the exterior surface of the composition layer sufficient to melt the unirradiated portion of the composition layer, causing a portion of the layer to liquefy. If the normal operating environment is carefully controlled to be at a constant temperature, the heater can be turned off or omitted from the apparatus. As is disclosed in U.S. Pat. No. 6,797,454 B1, it is also possible that the base member be cooled by cooling means, such as, a blower directing a stream of air at the surface of the photosensitive element and the drum and/or by the circulating of cooling fluid beneath the surface of the base member to cool the element. It is also contemplated that a fluid, such as water, may be circulated beneath the surface of the base member to heat and or cool the element. The temperature of the outer surface of the base member is about 50 to 156° F. (10 to 65.6° C.), preferably 75 to 95° F. (23.9 to 35° C.).

Contacting the photosensitive element with the development medium allows at least a portion of the liquefied material on the composition layer to be removed by the development medium. By maintaining more or less intimate contact of the development medium with the composition layer that is molten in the uncured regions, a transfer of the uncured photosensitive material from the photopolymerizable layer, i.e., partially liquefied portions, to the development medium takes place. Intimate contact of the development medium to the photopolymerizable layer may be maintained by the pressing the layer and the development medium together. The thermal development or thermal treating, which includes the steps of heating the photosensitive element and contacting the development medium to an exterior surface of the element, can be done at the same time, or in sequence provided that the uncured portions of the photopolymerizable layer are still soft or in a melt state when contacted with the development medium.

Removal or transfer of the liquefied portion from the photosensitive element to the development medium is sometimes also referred to as absorption. However, the use of the term absorption in defining the relative physical property between the development medium and the melted uncured polymeric composition is not intended to be limited to particular absorptive phenomena. There need not be penetration of the melted composition into the body of fibers, filaments or particles used for the absorbent material. The absorption into the bulk of the development material may be only by surface wetting of the interior bulk. The driving force for the movement of the melted elastomeric composition into the absorptive areas of the development medium may be one or more of surface tension, electrical forces, polarity attraction or other physical forces known to assist in promoting philicity (that is, an affinity for), adsorption, or absorption of materials. The driving force may also include pressure driven flow into a porous media.

The photosensitive element and the development medium are brought into contact with each other by relative motion between the supply member and the base member, U.S. Pat. Nos. 5,279,697 and U.S. Pat. No. 6,797,454 each describe relative motion between a drum (i.e. base member) and a hot roller (i.e., supply member). It is well within the ordinary skill of those in the art to provide relative motion between the base member and the supply member in thermal development apparatuses in order to contact the element with the development medium. Relative motion between the base member and the supply member is a means for contacting the element to the development medium. Moving the supply member and/or the base member are towards each other, forms a nip between the photosensitive element (supported by the base member) and the supply member with the development medium between the element and the supply member. The nip is the location where the supply member is in an engaged position against the base member. The supply member carrying the development medium is engaged against the photosensitive element at least in contact and, in some embodiments, in pressure contact. In some embodiments, a uniform or substantially uniform pressure is applied at the nip across the width of the element during processing. This uniform pressure assumes that the image across the nip is uniform; those skilled in the art will recognize that the pressure applied will vary locally as image elements pass through the nip. Pressure is applied to force the development medium into intimate contact with the photosensitive element. Pressure between about 0.70 kilograms per square centimeter and about 24 kilograms per square centimeter, preferably between about 2 kilograms per square centimeter and about 12 kilograms per square centimeter in the nip area is adequate to enhance the transfer from the element surface to the development medium without distorting the relief features on the element. Since the presence of the layer of the conformable material underneath the photosensitive element provides increased contact of the development medium to the relief surface of the element, it is contemplated that the pressure at the nip can operate at the low end of the above pressure range, and can be reduced to less than 0.7 kilograms per square centimeter to minimize the possibility of distorting the relief features. Also, since the presence of the layer of conformable material underneath the photosensitive element provides increased contact of the development medium to the relief surface of the element (i.e., improved conformity) at a given pressure, the removal of unpolymerized material from recessed areas in the relief surface is more efficient and thorough. The conformable layer underneath the photosensitive element provides improved uniformity of clean out in the recessed areas across various image features in the relief surface of the printing element.

The development medium, particularly when in continuous web form, typically is under tension during thermal development. It should be understood that the development medium as a web may be under tension control, velocity control, or a combination thereof for transport through the processor, but the development medium may still be under tension from at least at the point of separation of the development medium from the photosensitive element to a downstream drive mechanism. It is within the ordinary skill in the art to contemplate embodiments of tensioning the web, and implementing tension control, velocity control or combinations thereof for the transport of the medium through the apparatus. Embodiments for tensioning the web include providing brakes on one or more rollers and/or transporting the web about one or more rollers from supply to windup. The brakes provide tension on the development medium as the medium transports through the processor by a drive roller. In one embodiment where the development medium is a continuous web, a suitable range of tension is from about 0.1 to 10 lbs/in (0.2 to 17.5 Newtons/cm), preferably 0.3 to 5 lbs/in (0.5 to 8.8 Newtons/cm), and in another embodiment 0.5 to 1.0 lbs/in (0.875 to 1.75 Newtons/cm).

Photosensitive Element

The present invention is not limited to the type of element that is thermally processed. In one embodiment, the photosensitive element includes a flexible substrate and a composition layer mounted on the substrate. The composition layer is at least one layer on the substrate capable of being partially liquefied. In one embodiment, the photosensitive element is an elastomeric printing element suitable for use as a flexographic printing form. In another embodiment, the photosensitive element is a relief printing form suitable for use in letterpress printing. In another embodiment, the photosensitive element is a relief printing form suitable for gravure-like printing. The at least one layer on the substrate is preferably a photosensitive layer, and most preferably a photopolymerizable layer of an elastomeric composition wherein the photosensitive layer can be selectively cured by actinic radiation. As used herein, the term "photopolymerizable" encompasses systems that are photopolymerizable, photocrosslinkable, or both. In cases where the composition layer comprises more than one photosensitive layer on the flexible substrate, the composition of each of the photosensitive layers can be the same or different from any of the other photosensitive layers.

The layer of the photosensitive composition is capable of partially liquefying upon thermal development. That is, during thermal development the uncured composition must soften or melt at a reasonable processing or developing temperature. At least the exterior surface of the composition layer is heated to a temperature sufficient to cause a portion of the layer to liquefy, soften or melt.

The photosensitive layer includes at least one monomer and a photoinitiator, and optionally a binder. The at least one monomer is an addition-polymerizable ethylenically unsaturated compound with at least one terminal ethylenic group. Monomers that can be used in the photosensitive layer are well known in the art and include monofunctional acrylates and methacrylates, multifunctional acrylates and methacrylates, and polyacryloyl oligomers. Further examples of monomers can be found in U.S. Pat. Nos. 4,323,636; 4,753,865; and 4,726,877. A mixture of monomers may be used.

The photoinitiator is a compound that generates free radicals upon exposure to actinic radiation. Any of the known classes of photoinitiators, particularly free radical photoinitiators may be used. Alternatively, the photoinitiator may be a mixture of compounds, one of which provides the free radicals when caused to do so by a sensitizer activated by radiation.

The optional binder is a preformed polymer that serves as a matrix for the monomer and photoinitiator prior to exposure and is a contributor to the physical properties of the photopolymer both before and after exposure. In one embodiment the optional binder is elastomeric. A non-limiting example of an elastomeric binder is an A-B-A type block copolymer, where A represents a nonelastomeric block, preferably a vinyl polymer and most preferably polystyrene, and B represents an elastomeric block, preferably polybutadiene or polyisoprene. Other suitable photosensitive elastomers that may be used include polyurethane elastomers, such as those described in U.S. Pat. Nos. 5,015,556 and 5,175,072. The monomer or mixture of monomers must be compatible with the binder to the extent that a clear, non-cloudy photosensitive layer is produced.

Additional additives to the photosensitive layer include colorants, processing aids, antioxidants, and antiozonants. Processing aids may be such things as low molecular weight polymers compatible with the elastomeric block copolymer. Antiozonants include hydrocarbon waxes, norbornenes, and vegetable oils. Suitable antioxidants include alkylated phenols, alkylated bisphenols, polymerized trimethyldihydroquinone, and dilauryl thiopropionate.

The photosensitive element may include one or more additional layers on the side of the photosensitive layer opposite the substrate. Examples of additional layers include, but are not limited to, a release layer, a capping layer, an elastomeric layer, a laser radiation-sensitive layer, an actinic radiation opaque layer, a barrier layer, and combinations thereof. The one or more additional layers preferably are removable, in whole or in part, by contact with the development medium in the range of acceptable developing temperatures for the photosensitive element used. One or more of the additional other layers can cover or only partially cover the photosensitive composition layer. An example of an additional layer which only partially covers the photosensitive composition layer is a masking layer that is formed by imagewise application, e.g., ink jet application, of an actinic radiation blocking material or ink.

The release layer protects the surface of the composition layer and enables the easy removal of a mask used for the imagewise exposure of the photosensitive element. Materials suitable as the release layer are well known in the art. Suitable compositions for the capping layer and methods for forming the layer on the element are disclosed as elastomeric compositions in a multilayer cover element described in Gruetzmnacher et al., U.S. Pat. Nos. 4,427,759 and 4,460,675. The elastomeric capping layer is similar to the photosensitive layer in that after imagewise exposure the elastomeric capping layer is at least partially removable by contact with an absorbent material in the range of acceptable temperatures for the photosensitive element used.

In one embodiment, the laser radiation sensitive layer is sensitive to infrared laser radiation, and thus may be identified as an infrared-sensitive layer. The laser radiation sensitive layer can be on the photosensitive layer, or on a barrier layer which is on the photosensitive layer, or on a temporary support which together with the photosensitive element form an assemblage. Infrared-sensitive layers and actinic radiation opaque layers are well known in the art. The infrared-sensitive layer can be ablated (i.e., vaporized or removed) from the photosensitive layer on the side opposite the flexible substrate by exposure to infrared laser radiation. Alternatively, when the photosensitive element forms an assemblage with the support carrying the infrared-sensitive layer, the infrared-sensitive layer can be transferred from the temporary support to the external surface (the side opposite the flexible substrate) of the photosensitive layer by exposure to infrared laser radiation. The infrared-sensitive layer can be used alone or with other layers, e.g., ejection layer, heating layer, etc.

The infrared-sensitive layer generally comprises an infrared-absorbing material, a radiation-opaque material, and an optional binder. Dark inorganic pigments, such as carbon black and graphite, generally function as both infrared-sensitive material and radiation-opaque material. The thickness of the infrared-sensitive layer should be in a range to optimize both sensitivity and opacity to actinic radiation (e.g., has an optical density of ≥2.5). Such infrared-sensitive photoablative or phototransferable layer can be employed in digital direct-to-plate image technology in which the exposure by laser radiation removes or transfers the infrared-sensitive layer to form an in-situ mask on the photosensitive element. Suitable infrared-sensitive compositions, elements, and their preparation are disclosed in U.S. Pat. Nos. 5,262,275; 5,719,009; 5,607,814; 5,506,086; 5,766,819; 5,840,463; and EP 0 741 330 A1. The infrared-sensitive layer preferably is removable by contact with an absorbent material in the range of acceptable developing temperatures for the photosensitive element used.

The photosensitive element of the present invention may further include a temporary coversheet on top of the uppermost layer of the photosensitive element. One purpose of the coversheet is to protect the uppermost layer of the photosensitive element during storage and handling. Depending upon end use, the coversheet may or may not be removed prior to imaging, but is removed prior to development. Suitable materials for the coversheet are well known in the art.

The substrate is selected to be tear resistant and must have a fairly high melt point, for example, above the liquefying temperature of the composition layer formed on the substrate. The material for the substrate is not limited and can be selected from polymeric films, foams, fabrics, and metals such as aluminum and steel. The substrate can be almost any polymeric material that forms films that are non-reactive and remain stable throughout the processing conditions. Examples of suitable film supports include cellulosic films and thermoplastic materials such as polyolefins, polycarbonates, and polyester. The shape of the support is not limited. The support may be in sheet form or in cylindrical form, such as a sleeve. The sleeve may be formed from single layer or multiple layers of flexible material. Flexible sleeves made of polymeric films are preferred, as they typically are transparent to ultraviolet radiation and thereby accommodate backflash exposure for building a floor in the cylindrical printing element. Multiple layered sleeves are also acceptable and may include an adhesive layer or tape between the layers of flexible material. The sleeve may also be made of non-transparent, actinic radiation blocking materials, such as nickel or glass epoxy. The sleeve typically has a wall thickness from 10 to 80 mils (0.025 to 0.203 cm) or more. Preferred wall thickness for the cylinder form is 10 to 40 mils (0.025 to 0.10 cm).

The substrate of the photosensitive element has a thickness of between about 0.01 mm and about 0.38 mm. The radiation curable composition layer is between about 0.35 mm and about 7.6 mm thick, with a preferred thickness of about 0.5 mm to 3.9 mm (20 to 155 mils).

The photosensitive element is prepared for thermal development by imagewise exposing the element to actinic radiation. After imagewise exposure, the photosensitive element contains cured portions in the exposed areas of the radiation curable composition layer and uncured portions in the unexposed areas of the radiation curable composition layer. Imagewise exposure is carried out by exposing the photosensitive element through an image-bearing mask. The image-bearing mask may be a black and white transparency or negative containing the subject matter to be printed, or an in-situ mask formed with the laser radiation sensitive layer on the composition layer, or other means known in the art. Imagewise exposure can be carried out in a vacuum frame or may be conducted in the presence of atmospheric oxygen. On exposure, the transparent areas of the mask allow addition polymerization or crosslinking to take place, while the actinic radiation opaque areas remain uncrosslinked. Exposure is of sufficient duration to crosslink the exposed areas down to the support or to a back exposed layer (floor). Imagewise exposure time is typically much longer than backflash time, and ranges from a few to tens of minutes.

For direct-to-plate image formation as disclosed in U.S. Pat. Nos. 5,262,275; 5,719,009; 5,607,814; 5,506,086; 5,766,819; 5,840,463 and EP 0 741 330 A1 the image-bearing mask is formed in-situ with the laser radiation sensitive layer using an infrared laser exposure engine. The imagewise laser exposure can be carried out using various types of infrared lasers, which emit in the range 750 to 20,000 nm, preferably in the range 780 to 2,000 nm. Diode lasers may be used, but Nd:YAG lasers emitting at 1060 nm are preferred.

Actinic radiation sources encompass the ultraviolet, visible and infrared wavelength regions. The suitability of a particular actinic radiation source is governed by the photosensitivity of the initiator and the at least one monomer used in preparing the flexographic printing plates from the photosensitive element. The preferred photosensitivity of most common flexographic printing plates is in the UV and deep visible area of the spectrum, as they afford better room-light stability. The portions of the composition layer that are exposed to radiation chemically cross-link and cure. The portions of the composition layer that are unirradiated (unexposed) are not cured and have a lower melting or liquefying temperature than the cured irradiated portions. The imagewise exposed photosensitive element is then ready for heat development with the absorbent material to form a relief pattern.

An overall back exposure, a so-called backflash exposure, may be conducted before or after the imagewise exposure to polymerize a predetermined thickness of the photopolymer layer adjacent the support. This polymerized portion of the photopolymer layer is designated a floor. The floor thickness varies with the time of exposure, exposure source, etc. This exposure may be done diffuse or directed. All radiation sources suitable for imagewise exposure may be used. The exposure is generally for 10 seconds to 30 minutes.

Following overall exposure to UV radiation through the mask, the photosensitive printing element is thermally developed as described above to remove unpolymerized areas in the photopolymerizable layer and thereby form a relief image. The thermal development step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer.

After thermal development, the flexographic printing form may be post exposed and/or chemically or physically after-treated in any sequence to complete the photopolymerization and detackify the surface of the flexographic printing form.

EXAMPLES

In the following examples, CYREL® photopolymer printing elements, CYREL® exposure unit, CYREL® FAST TD4260 processor, CYREL® Digital Imager are all available from The DuPont Company (Wilmington, Del.).

Example 1

This example demonstrates that the presence of a conformable layer between a photosensitive element and a support surface for the element in a thermal development apparatus provides improved removal or clean-out of unpolymerized material from the element.

The photosensitive element used was a CYREL® photopolymer printing element, type 67DFM, which has a thickness of 67 mils (0.170 cm) of both photopolymerizable layer and support. The printing element was 42 inch wide by 60 inch length (106.7 by 152.4 cm). The photopolymer printing element may also be referred to as the photosensitive element. The element included an infrared-sensitive laser ablatable layer (i.e., actinic radiation opaque layer) adjacent the photopolymerizable layer. An in-situ mask was formed on the photosensitive element by mounting the element on a drum of a CYREL® Digital Imager and imagewise exposing the actinic radiation opaque layer to infrared laser radiation Nd:YAG laser (light wavelength output at 1064 nm) to selectively remove the layer and form the in-situ mask image. The mask image created contained a pattern of images that upon thermal development presented a challenge to attain sufficient clean-out or relief depth between raised portions relative to open floor portions. The mask image included line screen work of 133 lpi, minimally 1% dots, and a repeating pattern of large solid printing areas. The pattern included two adjacent solid rectangular blocks of about 18.5 inch by 3.5 inch (47 cm by 8.9 cm) with a gap of about 2 inch (5.1 cm) between the two blocks. The pattern of blocks was repeated about two inches apart on the element. The mask image was the same for all elements. The element was exposed on a CYREL® exposure unit to ultraviolet radiation at 365 nm for a overall exposure through the support for 21 seconds and for imagewise exposure through the in-situ mask in air for 6 minutes.

All the photosensitive elements were processed in a CYREL®FAST TD4260 thermal development apparatus using the same modified processing conditions described as follows to form a relief surface suitable for flexographic printing. The apparatus included an infrared preheater that was from Hereaus, Model No. 74432. The development medium was polyester nonwoven. A cycle (or pass) of the printing element is essentially one rotation of the drum in the thermal processor which constituted heating the element, contacting the element with a web of a development medium to remove unpolymerized portions, and separating the development medium from the element. The element was oriented on a support drum of the apparatus such that the pattern of two rectangular blocks was transverse to the (rotational) direction at which the element traveled during thermal treatment. After thermal processing, the element having the relief surface, i.e., printing plate, was post exposed and light finished for 10 minutes and 5 minutes, respectively.

| Thermal Development Conditions Example 1 | |
|---|---|
| Hot roll Temperature 300° F. Drum Temperature 75° F. | Chiller Temperature 73° F. Pressure (at nip) 71 pounds per linear inch |

| Cycle | Pressure | Speed (ipm*) | IR (% Power) |
|---|---|---|---|
| 1 | 100% | 50 | 20 |
| 2 | 100% | 50 | 20 |
| 3 | 100% | 50 | 20 |
| 4 | 100% | 50 | 20 |
| 5 | 100% | 50 | 20 |
| 6 | 100% | 50 | 20 |
| 7 | 100% | 50 | 20 |
| 8 | 100% | 50 | 20 |
| 9 | 100% | 50 | 20 |
| 10 | 100% | 50 | 20 |
| 11 | 100% | 50 | 20 |

*ipm is inch per minute

For each Test in the Example, a different conformable layer was placed between the support side of the exposed photosensitive element and the support drum of the thermal development apparatus. A single ply of the conformable layer was used between the element and a coated surface of the drum. A clamp on the drum held the leading end of the element and the conformable layer on the drum. As a Control, the exposed photosensitive element was positioned directly on the coated surface of the support drum of the thermal development apparatus. The coated surface of the drum was resilient layer of a silicone rubber having a Shore A durometer of 50. Although in the Tests 1-3 the conformable layer was placed on the resilient layer of the drum, it is believed that the underlying resilient layer did not or only minimally influence the results, since the difference in compression modulus between the two materials is 2 orders of magnitude. Also, the results demonstrated that the presence of the conformable layer provided a significant improvement in the relief clean-out and uniformity.

The materials tested as the conformance layer were as follows.

| Test | Conformance Material (density) | Thickness | Manufacturer | Shore A (reported by Manufacturer) |
|---|---|---|---|---|
| Test 1 | Polyethylene foam (2 lb/ft³) | 2 mm | Sekisui Voltek | 7* |
| Test 2 | Polyethylene foam (4 lb/ft³) | 2 mm | Sekisui Voltek | 15 |
| Test 3 | Polyethylene foam (5.3 lb/ft³) | 2 mm | Sekisui Voltek | 23 |

*Shore A values less than 10 cannot be measured reliably, according to the manufacturer.

The conformable layer for Test 3 and the Control was also measured for Shore A using a Shore Durometer Hardness Gauge Type "A-2" manufactured by The Shore Instrument & Manufacturing Company, Inc. (Jamaica, N.Y., USA). The Shore A of the conformance layers for Tests 1 and 2 were not measured, and instead the Shore A as reported by the supplier was relied upon.

A compression test was conducted on each of the conformable layers based on the protocol of Test C of ASTM D3574-05, with the following noted exceptions. The compression test was conducted on an Instron Model#1125 (Instron Norwood, Mass.), using a compression fixture from JT&M Die Set Part#3MDS, from Janesville Tool & Manufacturing Inc., (Milton, Wis., USA) to keep both surfaces of the compression foot and the horizontal plate parallel, and an EIN-5 Laser Extensometer to precisely measure the compression strain on the sample. The compression foot exerted a load on the sample of conformable material between 0 and 5000 lbs., and moved at a rate of 50±5 mm per minute. The conformable material was tested as supplied and used in the thermal development process, that is, the compression test was conducted on a single ply of the foam material having the stated thickness. For each conformable material in the Tests and the Control, a compression stress-strain curve was plotted from the recorded data of the load versus displacement of the foam, and the compression modulus was determined from a slope of the initial region of the stress-strain curve. The test results are reported as compression modulus in units of pounds per square inch (psi).

Each plate was evaluated for relief depth in the open floor (between the pattern of rectangular blocks, where there is no raised image in the transverse orientation of the plate) and for the relief depth in the 2 inch gap, termed the critical gap or critical gap relief, between the adjacent rectangular raised blocks. Several measurements were made of the relief depth in these areas on the plate and the average is reported in the following Table.

| Test | Conformance Layer Durometer (Shore A) | Conformance Layer Compression Modulus (psi) | Open Floor Relief (mils) | Critical Gap Relief (mils) | Difference |
|---|---|---|---|---|---|
| Test 1 | 7* | 23.7 | 29.5 | 23.7 | 5.8 |
| Test 2 | 15* | 75.1 | 28.5 | 21.7 | 6.0 |
| Test 3 | 25 | 98.6 | 26.7 | 21.7 | 5.0 |
| Control | 50 | 1644 | 27.7 | 11.1 | 16.6 |

*The Shore A as reported by the manufacturer of the material used for Tests 1 and 2.

The results clearly demonstrated that a conformable layer having a Shore A of 25 or less provided improved clean-out of the recessed areas in the relief surface of the printing plate. The relief formed in the critical gap for Tests 1 through 3 was about twice the relief depth formed in the critical gap for the Control (in which the drum surface had a resilient layer with a Shore A of 50). Since the relief depth formed in the critical gap is close (or much closer) to the relief depth of the open floor (i.e., the smaller the difference) Tests 1-3 demonstrated that the clean-out of the recessed or relief areas was significantly improved by the presence of the conformable layer under the photosensitive element during thermal processing.

Example 2

This example demonstrates that the presence of a conformable layer between a photosensitive element and a support surface for the element in a thermal development apparatus provides improved removal or clean-out of unpolymerized material from the element.

The photosensitive element used was a CYREL® photopolymer printing element, type 67DFM, which has a thickness of 67 mils (0.170 cm) of both photopolymerizable layer and support. The printing element was 21 inch wide by 30 inch length (53.3 cm by 76.2 cm). The photopolymer printing element may also be referred to as the photosensitive element. The element included an infrared-sensitive laser ablatable layer (i.e., actinic radiation opaque layer) adjacent the photopolymerizable layer. An in-situ mask was formed on the photosensitive element by mounting the element on a drum of a CYREL® Digital Imager and imagewise exposing the actinic radiation opaque layer to infrared laser radiation Nd:YAG laser (light wavelength output at 1064 nm) to selectively remove the layer and form the in-situ mask image. The mask image created contained a pattern of images that upon thermal development presented a challenge to attain sufficient clean-out or relief depth between raised portions relative to open floor portions. The mask image (and the relief image ultimately formed on the printing plate after exposure through the mask and processing) included two rectangular solid areas, in which each rectangular image was about 14 in by 8 in (35.6 cm by 20.3 cm), symmetrically positioned on the plate. Each rectangular image was oriented on the element such that the longer dimension, i.e., 14 in (35.6 cm) of the rectangular image was parallel to the 30 in (76.2 cm) length of the element, and centered lengthwise to have 8 inch (20.3 cm) from an edge of the rectangular image to each of the leading edge and trailing ends of the element. The two rectangular images were placed side-by-side and centered width-wise on the 21 in (53.3 cm) dimension of the element so that there was a 2 inch (5.1 cm) gap between the adjacent rectangular images (i.e., the critical gap for the relief in the printing plate) and 1.5 inch (3.8 cm) from each side edge of the element to a side edge of the rectangular image. The open floor portions of the resulting printing plate were formed at the leading and trailing ends of the plate and were approximately 8 in by 21 in (20.3 cm by 53.3 cm).

The element was exposed on a CYREL® exposure unit to ultraviolet radiation at 365 nm for an overall exposure through the support for 21 seconds and for imagewise exposure through the in-situ mask in air for 6 minutes. The element was oriented on a support drum of the apparatus such that the pattern of two rectangular blocks was transverse to the rotational direction at which the element traveled during thermal treatment, that is, the 21 in (53.3 cm) width of the element was transverse to the direction of rotation and the 30 in (76.2 cm) length wrapped around the circumference of the drum support.

All the photosensitive elements for Tests 1 through 8 and the Control were processed in a CYREL®FAST TD4260 thermal development apparatus using the same modified processing conditions described as follows to form a relief surface suitable for flexographic printing. The apparatus included an infrared preheater that was from Hereaus, Model No. 74432. The development medium was polyester nonwoven. A cycle (or pass) of the printing element is essentially one rotation of the drum in the thermal processor which constituted heating the element, contacting the element with a web of a development medium to remove unpolymerized portions, and separating the development medium from the element. The element was oriented on a support drum of the apparatus such that the pattern of two rectangular blocks was transverse to the (rotational) direction at which the element traveled during thermal treatment. After thermal processing, the element having the relief surface, i.e., printing plate, was post exposed and light finished using UV-A and UV-C radiations, respectively. UV-C and UV-A are UV wavelengths that are typically used to ensure full curing of photopolymers; where UV-C represents radiation wavelengths of about 200 to 300 nm, and UV-A radiation wavelengths of about 310 to 400 nm.

Thermal Development Conditions
Example 2

| Hot roll Temperature 300° F. Drum Temperature 75° F. | | Chiller Temperature 73° F. Pressure (at nip) 71 pounds per linear inch | |
|---|---|---|---|
| Cycle | Pressure | Speed (ipm*) | IR (% Power) |
| 1 | 100% | 50 | 10 |
| 2 | 100% | 50 | 10 |
| 3 | 100% | 50 | 10 |
| 4 | 100% | 50 | 10 |
| 5 | 100% | 50 | 10 |
| 6 | 100% | 50 | 10 |
| 7 | 100% | 50 | 10 |
| 8 | 100% | 50 | 10 |
| 9 | 100% | 50 | 10 |
| 10 | 100% | 50 | 20 |
| 11 | 100% | 50 | 20 |

*ipm is inch per minute

For each Test in the Example, a fresh (i.e., unused) sheet of test material forming the conformable layer was placed between the support side of the exposed DFM photosensitive element and the support drum of the thermal development apparatus. The conformable materials used in Tests 1 through 8 had a width and length dimensions that were at least the same size as the width and length of the DFM plate that was thermally processed. A single ply of the conformable layer was used between the element and a coated surface of the drum. A clamp on the drum held the leading end of the element and the conformable layer on the drum. As a Control, the exposed photosensitive element was positioned directly (without a comfortable layer) on the coated surface of the support drum of the thermal development apparatus. The coated surface of the drum was resilient layer of a silicone rubber having a Shore A durometer of 50. Although in the Tests 1 through 8 the conformable layer was placed on the resilient layer of the drum, it is believed that the underlying resilient layer did not or only minimally influence the results, since the difference in compression modulus between the two materials was 2 orders of magnitude. Also, the results demonstrated that the presence of the conformable layer provided a significant improvement in the relief clean-out and uniformity of the relief structure of the thermally developed printing form. The materials tested as the conformance layer were as follows.

| Test | Conformance Material | Thickness | Manufacturer |
|---|---|---|---|
| Test 1 | Polyethylene foam (density 2 lb/ft$^3$) | 2 mm | Sekisui Voltek |
| Test 2 | Polyethylene foam (density 4 lb/ft$^3$) | 2 mm | Sekisui Voltek |
| Test 3 | Polyethylene foam (density 5.3 lb/ft$^3$) | 2 mm | Sekisui Voltek |
| Test 4 | Polyethylene foam (density 5.3 lb/ft$^3$) | 2 mm | Sekisui Voltek |
| Test 5 | Polymeric elastomeric material (CYREL ® DRC155 plate, fully exposed and light finished) | 3.9 mm | DuPont |
| Test 6 | Silicone Foam (type HT 870) | 2.4 mm | Rogers Corp. |
| Test 7 | Silicone Foam (type HT 800) | 2.4 mm | Rogers Corp |
| Test 8 | Silicone Foam (type HT 820) | 2.4 mm | Rogers Corp |

The polyethylene foam materials and silicone foam materials were converted and distributed by Sekisui Voltek, and Stockwell Elastomerics, Inc. (Philadelphia, Pa.), respectively. For Test 5 a CYREL® photopolymer printing element, type DRC 155, which has a thickness of 155 mils (393.7 cm) of both photopolymerizable layer and support, was used as a polymeric elastomeric conformable layer after the printing element was overall (i.e., blanket) exposure to ultraviolet radiation for 20 minutes (and no thermal development was needed). The Shore A durometer and compression modulus were measured for all the materials used in Tests 1 through 8, with the exceptions as noted below. The durometer and compression modulus of the polymeric elastomeric material of Test 5 was measured after overall exposure of the printing element.

The Shore A durometer of the conformance layers for Tests 1 and 2 were not measured, and instead the Shore A value as reported by the supplier was relied upon. The Shore A durometer reported for Tests 3 through 8 and the Control were measured using a Shore Durometer Hardness Gauge Type "A-2" manufactured by The Shore Instrument & Manufacturing Company, Inc. (Jamaica, N.Y., USA). A minimum of five readings for the Shore A durometer were taken and the average of the readings were reported.

A compression test was conducted on each of the conformable layers based on the protocol of Test C of ASTM D3574-05, with the noted exceptions. The compression test was conducted on an Instron Model#1125 (Instron Norwood, Mass.), using a compression fixture from JT&M Die Set Part#3MDS, from Janesville Tool & Manufacturing Inc., (Milton, Wis., USA) to keep both surfaces of the compression foot and the horizontal plate parallel, and an EIN-5 Laser Extensometer to precisely measure the compression strain on the sample. The compression foot exerted a load on the sample of conformable material between 0 and 5000 lbs., and moved at a rate of 50±5 mm per minute. The conformable material was tested as supplied and used in the thermal development process, that is, the compression test was conducted on a single ply of the foam material. For each conformable material in the Tests and the Control, a compression stress-strain curve was plotted from the recorded data of the load versus displacement of the foam, and the compression modulus was determined from a slope of the initial region of the stress-strain curve. The test results are reported as compression modulus in units of pounds per square inch (psi).

Each plate thermally processed with the particular conformable layer described above was evaluated for relief depth in the open floor (i.e., the area between the leading end or trailing end of the plate and the rectangular raised image blocks, in which there is no raised features), and, for the relief depth in the 2 inch (5.1 cm) critical gap between the adjacent rectangular raised image blocks. Several measurements were made of the relief depth in these areas on each plate and the average is reported in the following Table.

is an empirical and not a fundamental relationship that can be used for comparison across different types of materials (foam, rubber, etc.). In the context of thermal processing of photopolymer printing forms, the use of Shore A durometer to identify possible materials for the support layer fails to properly characterize its ability to compress and conform. In contrast, compression modulus is a basic material property (not a proxy) and a more suitable property to characterize the necessary ability of a material to conform and compress in the context of the invention. This point is clearly illustrated by Test 4 and Test 5 where the conformable materials have the same Shore A durometer value of 35 but very different compression modulus of 330 and 3790 psi, respectively. The difference in the compression modulus of the materials used for Tests 4 and 5 is consistent with their respective relief depth values in the critical gap which are significantly different (20.7 mil versus 15.0 mil).

The improvement in clean-out (i.e., polymer removal) using the indicated conformable materials for the Tests was attained by thermally processing the plate samples at lower hot roll temperature and reduced infrared heating power than is typically used for 67DFM plates. DFM plates are thermally treated typically at 330-340° F. heated roll temperature and 50

| Test | Conformance Layer Durometer (Shore A) | Conformance Layer Compression Modulus (psi) | Open Floor Relief Depth (mils) | Critical Gap Relief Depth (mils) | Difference between Relief Depths | % Difference |
|---|---|---|---|---|---|---|
| Test 1 | 7 | 23.7 | 23.4 | 20.1 | 3.3 | 14% |
| Test 2 | 15 | 75.1 | 25.1 | 23.6 | 1.5 | 6% |
| Test 3 | 25 | 98.6 | 24.5 | 21.8 | 2.7 | 11% |
| Test 4 | 35 | 330 | 23.5 | 20.7 | 2.8 | 12% |
| Test 5 | 35 | 3790 | 22.2 | 15.0 | 7.2 | 32% |
| Test 6 | ≤10 | 24.3 | 23.4 | 18.1 | 5.3 | 23% |
| Test 7 | ≤10 | 42.8 | 22.7 | 19.3 | 3.4 | 15% |
| Test 8 | ≤10 | 70.1 | 23.4 | 19.1 | 4.3 | 18% |
| Control | 50 | 1644 | 21.8 | 12.1 | 9.7 | 44% |

The results clearly demonstrated that a conformable layer having compression modulus less than about 1500 psi provided improved dean-out of the recessed areas in the relief surface of the printing plate. The relief depth formed in the critical gap for Tests 1 through 8 was about 50 to 100% of the relief depth formed in the critical gap for the Control (in which the drum surface had a resilient layer with a Shore A of 50 and a compression modulus of 1644). Since the relief depth formed in the critical gap is dose (i.e., the difference is only one sixth (⅙) to one half (½) of that of the Control) to the relief depth of the open floor (i.e., the smaller the difference), Tests 1-8 demonstrated that the presence of the conformable layer under the photosensitive element during thermal processing improved the dean-out of the relief areas of the plate, by increased removal of the unpolymerized material from the recessed areas to greater relief depth.

The results also demonstrated that the Shore Durometer method (Shore A is one of 12 scales) to measure resilience is not a proper descriptor for the characteristics of the comformable material suitable for use in thermal processing of photopolymer printing forms. The Shore Durometer method only provides an empirical hardness value that does not necessarily correlate well with fundamental properties of materials (e.g., modulus and strength). Shore hardness is a measure of resistance to certain types of indentations and is often used as a proxy for flexibility. The correlation between Shore hardness and flexibility may hold for similar materials, especially within a series of grades from the same product line, but this to 80% infrared heating power. Thus, energy consumption of the thermal development apparatus can be significantly reduced by the use of a conformable layer underlying the printing element during treatment. It is also expected that the generation of vapor and condensate from the photosensitive printing element during thermal treatment could also be reduced due to lower heat input needed to attain desired clean-out.

What is claimed is:

1. A thermal development apparatus for forming a relief printing form from a photosensitive element having an exterior surface, a side opposite the exterior surface, and containing a composition layer capable of being partially liquefied comprising:
   means for supplying a development medium to the exterior surface;
   means for supporting having an outer surface for supporting the photosensitive element on the side opposite the exterior surface;
   means for heating the exterior surface to a temperature sufficient to cause a portion of the composition layer to liquefy; and
   means for contacting the photosensitive element with the development medium to allow at least a portion of the composition layer that is liquefied to be removed by the development medium,
   wherein a layer of conformable material having a compression modulus between 3 and 1500 psi and a Shore A hardness of 25 or less is secured to the means for supporting.

2. The apparatus of claim 1 wherein the means for supporting has an exterior surface on which the conformable material is mounted.

3. The apparatus of claim 1 wherein the conformable material has a compression modulus between 3 and 100 psi.

4. The apparatus of claim 1 wherein the conformable material has a compression modulus between 5 and 75 psi.

5. The apparatus of claim 1 wherein the conformable material has a compression modulus between 10 and 350 psi.

6. The apparatus of claim 1 wherein the conformable material has a compression modulus between 10 and 1200 psi.

7. The apparatus of claim 1 wherein the conformable material is a layer contacting the side of the photosensitive element.

8. The apparatus of claim 1 wherein the conformable material is selected from the group consisting of foams and elastomeric materials.

9. The apparatus of claim 8 wherein the foam is selected from the group of natural foams and synthetic foams.

10. The apparatus of claim 1 wherein the conformable material is selected from the group consisting of polyethylenes, polyurethanes, polyesters, silicon rubbers, and polystyrenes.

11. The apparatus of claim 1 wherein the conformable material is a layer having a thickness of between 0.1 and 50 mm.

12. The apparatus of claim 1 wherein the conformable material is a layer formed from one or more plys of the conformable material.

13. The apparatus of claim 1 wherein the conformable material is a layer removable from means for supporting.

14. The apparatus of claim 1 wherein the conformable material forms a layer on a flexible carrier removably mounted on the means for supporting.

15. The apparatus of claim 1 wherein the means for contacting the photosensitive element presses the development medium and the exterior surface of the photosensitive element into contact at a pressure sufficient for at least a portion of the liquefied portion of the composition layer to be removed by the development medium.

16. The apparatus of claim 1 wherein the development medium is selected from the group consisting of non-woven materials, fibrous woven materials, paper stocks, porous materials, open-cell foams, and combinations thereof.

17. The apparatus of claim 1 wherein the means for heating is selected from the group consisting of conduction heater, convection heater, radiation heater, and combinations thereof.

18. The apparatus of claim 1 wherein the photosensitive element has been imagewise exposed to actinic radiation prior to heating.

19. The apparatus of claim 1 wherein the conformable material has a Shore A hardness less than 25.

20. The apparatus of claim 2 wherein the means for supporting is a drum.

* * * * *